US010232622B2

(12) United States Patent
Uchiyama

(10) Patent No.: US 10,232,622 B2
(45) Date of Patent: Mar. 19, 2019

(54) WATER-REPELLENT FILM, FILM FORMATION METHOD, NOZZLE PLATE, INK-JET HEAD, AND INK-JET RECORDING DEVICE

(71) Applicant: FUJIFILM Corporation, Tokyo (JP)

(72) Inventor: Hiroki Uchiyama, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 270 days.

(21) Appl. No.: 15/059,933

(22) Filed: Mar. 3, 2016

(65) Prior Publication Data

US 2016/0185119 A1 Jun. 30, 2016

Related U.S. Application Data

(63) Continuation of application No. PCT/JP2014/072995, filed on Sep. 2, 2014.

(30) Foreign Application Priority Data

Sep. 4, 2013 (JP) ................................ 2013-182900

(51) Int. Cl.
*B41J 2/165* (2006.01)
*B41J 2/16* (2006.01)
(Continued)

(52) U.S. Cl.
CPC ............ *B41J 2/165* (2013.01); *B41J 2/1433* (2013.01); *B41J 2/14233* (2013.01); *B41J 2/155* (2013.01);
(Continued)

(58) Field of Classification Search
None
See application file for complete search history.

(56) References Cited

U.S. PATENT DOCUMENTS 5,798,778 A 8/1998 Kimura et al.
2001/0017639 A1 8/2001 Noguchi et al.
(Continued)

FOREIGN PATENT DOCUMENTS

JP H6-210859 A 8/1994
JP 2001-233972 A 8/2001
(Continued)

OTHER PUBLICATIONS

Difference Between.net, "Difference Between PFA and PTFE" (http://www.differencebetween.net/science/chemistry-science/difference-between-pfa-and-ptfe/). (Year: 2012).*
(Continued)

*Primary Examiner* — David Sample
*Assistant Examiner* — Nicole T Gugliotta
(74) *Attorney, Agent, or Firm* — Studebaker & Brackett PC

(57) ABSTRACT

Disclosed is a water-repellent film 102 including a substrate 100, and a water-repellent organic material provided on the substrate 100, in which a plurality of regions having different concentrations of the water-repellent organic material are formed, and each of the regions having different concentrations continuously exists in a film thickness direction from a boundary surface with respect to the substrate to a surface of the water-repellent film. Preferably, in the regions having different concentrations, a region having a relatively higher concentration **102*a* is formed into the shape of a column, and a region having a relatively lower concentration 102*b*** than that of the columnar region exists around the columnar region.

17 Claims, 8 Drawing Sheets

(51) Int. Cl.

| | |
|---|---|
| ***B41J 2/155*** | (2006.01) |
| ***B41J 2/14*** | (2006.01) |
| ***F24V 99/00*** | (2018.01) |

(52) U.S. Cl.

CPC ........... *B41J 2/1606* (2013.01); *B41J 2/1642* (2013.01); *B41J 2/1645* (2013.01); *F24V 99/00* (2018.05); *B41J 2002/14459* (2013.01); *B41J 2002/16502* (2013.01)

(56) References Cited

U.S. PATENT DOCUMENTS

| | | | | |
|---|---|---|---|---|
| 2005/0163838 | A1* | 7/2005 | Moe | A61K 9/0007 424/466 |
| 2005/0219313 | A1* | 10/2005 | Sugahara | B41J 2/1606 347/40 |
| 2007/0030306 | A1 | 2/2007 | Okamura et al. | |
| 2009/0237453 | A1 | 9/2009 | Van Den Berg et al. | |
| 2010/0053269 | A1 | 3/2010 | Fujii et al. | |
| 2011/0050803 | A1 | 3/2011 | Wu et al. | |
| 2011/0074882 | A1 | 3/2011 | Uchiyama | |
| 2013/0292647 | A1* | 11/2013 | Laboriante | H01L 21/02063 257/40 |

FOREIGN PATENT DOCUMENTS

| | | | | |
|---|---|---|---|---|
| JP | 2005-313637 A | | 11/2005 | |
| JP | 2006-231783 A | | 9/2006 | |
| JP | 2008-105231 A | | 5/2008 | |
| JP | 2008-544852 A | | 12/2008 | |
| JP | 2009-149082 A | | 7/2009 | |
| JP | 2010-076422 A | | 4/2010 | |
| JP | 2010-194982 A | | 9/2010 | |
| JP | 2011-051341 A | | 3/2011 | |
| JP | 2011-073283 A | | 4/2011 | |
| WO | WO 2012/087352 A2 | * | 6/2012 | B05D 5/08 |

OTHER PUBLICATIONS

International Search Report of PCT/JP2014/072995 dated Oct. 14, 2014.

Written Opinion of PCT/JP2014/072995 dated Oct. 14, 2014.

* cited by examiner

WATER-REPELLENT FILM, FILM FORMATION METHOD, NOZZLE PLATE, INK-JET HEAD, AND INK-JET RECORDING DEVICE

CROSS-REFERENCE TO RELATED APPLICATIONS

The present application is a Continuation of PCT International Application No. PCT/JP2014/072995 filed on Sep. 2, 2014 claiming priority under 35 U.S.C § 119(a) to Japanese Patent Application No. 2013-182900 filed on Sep. 4, 2013. Each of the above applications is hereby expressly incorporated by reference, in their entirety, into the present application.

BACKGROUND OF THE INVENTION

1. Field of the Invention

The present invention relates to a water-repellent film, a film formation method, a nozzle plate, an ink-jet head, and an ink-jet recording device, and in particular, the present invention relates to a water-repellent film formed by disposing water-repellent organic material on a substrate.

2. Description of the Related Art

In an ink-jet head used in an ink-jet recording device, when ink is attached onto the surface of a nozzle plate, an ink droplet ejected from a nozzle is affected, and thus, a variation occurs in an ejection direction of the ink droplet. When the variation occurs in the ejection direction of the ink droplet, it is difficult to land the ink droplet in a predetermined position on a recording medium, and thus, the variation becomes a factor of deterioration in image quality.

For this reason, a water-repellent film is formed on the surface of the nozzle plate, and thus, the ink is prevented from being attached onto the surface of the nozzle plate, and ejection performance is improved.

For example, a fluorine-containing silane coupling agent having a straight chain structure is used as the water-repellent film. The fluorine-containing silane coupling agent having a straight chain structure is able to exhibit high adhesiveness with respect to an oxide film or a surface having an OH group in spite of the thickness of a monolayer, and is able to provide high water repellency to the surface of a film formation target.

However, a problem has been known in which film deterioration due to a remarkable hydrolytic action of an aqueous solution, in particular, an alkali solution with respect to the surface on which the water-repellent film is formed and film deterioration due to a sliding operation (wiping) such as rubbing of a blade or the like occur.

In JP2008-544852A, it is disclosed that tridecafluoro-1,1,2,2-tetra-hydro-octyl trichlorosilane (FOTS) and 1H, 1H, 2H, 2H-perfluorodecyltrichlorosilane (FDTS) are used as a water-repellent silane coupling agent having a straight chain structure, and a base substrate treatment is performed, and thus, durability is enhanced.

In addition, in JP2010-76422A, it is disclosed that control of a film structure in which a monolayer is formed, and a separate film is further laminated on the monolayer is performed, and thus, durability is enhanced.

SUMMARY OF THE INVENTION

However, in the water-repellent organic material such as a fluorine-containing silane coupling agent having a straight chain structure which is applied to JP2008-544852A, it has been known that a droplet is unlikely to fall on the water-repellent organic material (a falling angle=a sliding down angle is high), and thus, a so-called dynamic water repellency deteriorates. For this reason, residue traces such as liquid residues or coffee-stains remain on the surface of the nozzle plate. The residue traces accelerate deterioration of the water-repellent film and cause residue attachment or clogging of the ink droplet in the vicinity of the nozzle, and thus, considerably affect ejection performance of the ink-jet head.

In addition, in JP2010-76422A, it is considered that a water-repellent substance (a second layer) is formed on a water-repellent layer (first layer), and thus, a bonding force is weakened, and the second layer providing durability easily flows due to sliding such as wiping. For this reason, it is considered that a region is obtained in which durability of only the first layer decreases, and an enhancement effect of durability and water repellency decreases. In addition, in a case where the second layer is in the shape of an island, it is assumed that when a protruding portion is rubbed by wiping or the like, the portion is easily cracked first, and it is considered that the island-like portion flows, and thus, homogeneity itself of water repellency of the film surface is also unstable.

The present invention has been made in consideration of the circumstances described above, and an object of the present invention is to provide a water-repellent film having excellent durability and dynamic water repellency, a film formation method, a nozzle plate, an ink-jet head, and an ink-jet recording device.

In order to attain the object described above, the present invention provides a water-repellent film including a substrate, and a water-repellent organic material provided on the substrate, in which a plurality of regions having different concentrations of the water-repellent organic material are formed, and each of the regions having different concentrations continuously exists in a film thickness direction from a boundary surface with respect to the substrate to a surface of the water-repellent film.

In spite of the thickness at the level of a monolayer, the water-repellent film of the present invention is able to provide high durability (chemical resistance and abrasion resistance) compared to the related art, and high dynamic water repellency which is rarely realized in the straight chain silane coupling agent of the related art, according to the film structure.

Furthermore, herein, the "boundary surface with respect to the substrate", for example, indicates a "boundary surface with respect to an oxide film" when the oxide film is formed between the substrate and the water-repellent film. Herein, in the substrate which also includes an underlayer such as the oxide film, the boundary surface with respect to the substrate indicates a boundary surface with respect to the underlayer when the underlayer is included.

In addition, in order to attain the object described above, the present invention provides a water-repellent film including a substrate, and a water-repellent organic material provided on the substrate, in which a homogeneous layer having a homogeneous concentration of the water-repellent organic material is included on a surface of the water-repellent film, a plurality of regions having different concentrations of the water-repellent organic material are formed in the water-repellent film excluding the homogeneous layer, and each of the regions having different concentrations continuously exists in a film thickness direction from a boundary surface with respect to the substrate to the homogeneous layer.

In this aspect, the homogeneous layer having a homogeneous concentration of the water-repellent organic material may be included on the surface of the water-repellent film, and it is possible to further improve durability by including the homogeneous layer.

In this aspect, it is preferable that the regions having different concentrations are formed such that a region having a relatively higher concentration has a columnar structure, and a region having a relatively lower concentration than that of the columnar structure exists around the columnar structure.

In this aspect, it is preferable that a sectional area of the columnar structure obtained by cutting the columnar structure in a surface parallel to the boundary surface with respect to the substrate is less than or equal to 100 $\mu m^2$, and it is more preferable that the sectional area of the columnar structure is less than or equal to 10 $\mu m^2$.

The water-repellent film has a columnar structure and is strongly bonded to the substrate, and a columnar portion having a high concentration (a high density) exists, and thus, it is possible to realize high durability by a pinning effect. Further, areas having different concentrations (densities), that is, areas having different water repellencies are formed on the film surface, and thus, it is possible to exhibit high dynamic water repellency. In addition, the columnar structure continuously exists from the boundary surface of the substrate, and thus, even when the film is subjected to erosion due to wiping or ink, it is possible to exhibit a certain durability and dynamic water repellency until the film is eliminated.

In this aspect, it is preferable that the water-repellent organic material is a silane coupling agent. Alternatively, it is preferable that the water-repellent organic material is a phosphonic acid derivative.

The water-repellent organic material is the silane coupling agent or the phosphonic acid derivative, and thus, the water-repellent film is strongly bonded to the substrate.

In this aspect, it is preferable that the water-repellent organic material contains fluorine, and it is more preferable that the water-repellent organic material includes an ether bond.

In this aspect, it is preferable that the water-repellent organic material is formed by a gas phase method.

In this aspect, it is preferable that the water-repellent film is formed by being held at least one time at an arbitrary temperature lower than a glass transition temperature Tg of the water-repellent organic material for a certain period of time under an atmosphere in which a vacuum degree is less than or equal to 100 (Pa), and by setting a temperature to be higher than or equal to the glass transition temperature Tg.

Thus, the water-repellent film is formed by being held at least one time at an arbitrary temperature lower than a glass transition temperature Tg of the water-repellent organic material for a certain period of time under an atmosphere in which a vacuum degree is less than or equal to 100 (Pa), and then by setting the temperature to be higher than or equal to the glass transition temperature Tg, and thus, it is possible to provide the water-repellent film in which the plurality of regions having different concentrations of the water-repellent organic material are formed, and the regions having different concentrations continuously exist in the film thickness direction from the boundary surface with respect to the substrate.

The water-repellent film of this aspect is formed on a nozzle plate of the present invention. Then, an ink-jet head of the present invention includes the nozzle plate of this aspect. In addition, an ink-jet recording device of the present invention includes the ink-jet head of this aspect.

According to the present invention, it is possible to provide a water-repellent film having excellent durability and dynamic water repellency, a film formation method, a nozzle plate, an ink-jet head, and an ink-jet recording device.

DESCRIPTION OF THE PREFERRED EMBODIMENTS

Hereinafter, a preferred embodiment of the present invention will be described according to the appended drawings. The present invention will be described by the following preferred embodiment, but modification is able to be performed by various methods within a range not departing from the scope of the present invention, and embodiments other than this embodiment are able to be used. Therefore, all modifications in the scope of the present invention are included in claims.

<Water-Repellent Film>

Figure 1A:
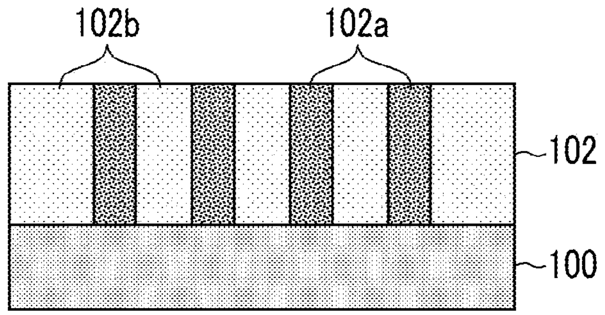
FIG. 1A is a schematic diagram for illustrating a structure of a water-repellent film according to the present invention.
Figure 1B:
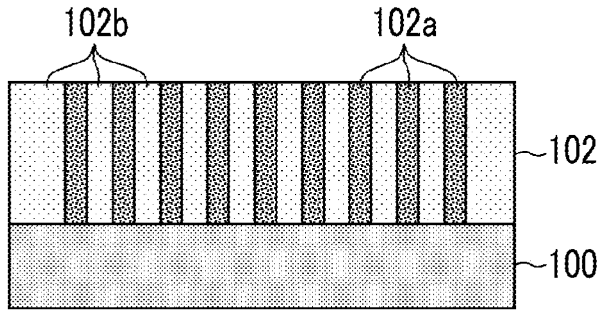
FIG. 1B is a schematic diagram for illustrating the structure of the water-repellent film according to the present invention.
Figure 1C:
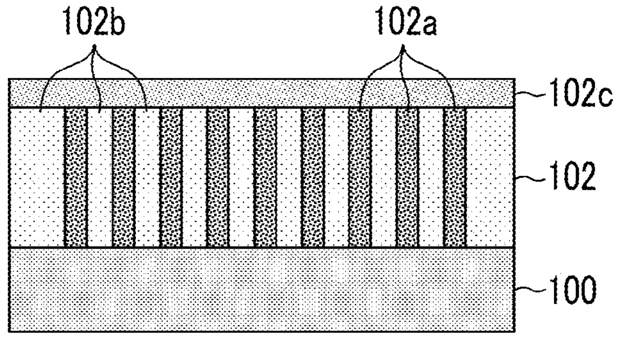
FIG. 1C is a schematic diagram for illustrating the structure of the water-repellent film according to the present invention.

As illustrated in FIG. 1A to FIG. 1C, a water-repellent film of this embodiment is formed by disposing a water-repellent organic material on a substrate 100. Then, a plurality of regions having different concentrations of the water-repellent organic material are formed, and each of the regions having different concentrations continuously exists in a film thickness direction from a boundary surface with respect to the substrate to a surface of the water-repellent film.

As illustrated in FIG. 1A, in a water-repellent film 102, it is preferable that the regions having different concentrations are formed such that a region having a relatively higher concentration 102*a* is formed in the shape of a column, and a region having a relatively lower concentration 102*b* than that of the columnar region exists around the columnar region.

The water-repellent film of this embodiment has a film structure in which a plurality of regions having different concentrations (densities) are formed by using a water-repellent organic material from an initial growth stage of film formation from a base substrate, and are continuously grown up to the uppermost surface of the film. In spite of the thickness at the level of a monolayer, it is possible to provide high durability (chemical resistance and abrasion resistance) compared to the related art, and high dynamic water repellency which is rarely realized in the straight chain silane coupling agent of the related art to the water-repellent film, according to the film structure.

The water-repellent film 102 has a columnar structure and is strongly bonded to the substrate, and a columnar portion having a high concentration (a high density) exists, and thus, it is possible to realize high durability by a pinning effect. Further, areas having different concentrations (densities), that is, areas having different water repellencies are formed on the film surface, and thus, it is possible to exhibit high dynamic water repellency. In addition, the columnar structure continuously exists from the boundary surface of the substrate, and thus, even when the film is subjected to erosion due to wiping or ink, it is possible to exhibit a certain durability and dynamic water repellency until the film is eliminated.

Furthermore, in this embodiment, the areas having different concentrations (densities) are distributed at a constant ratio. When the water-repellent film 102 has a columnar structure, for example, it is preferable that a distance between the closest columnar structures is in a range of 10 nm to 5000 nm.

In this embodiment, a sectional area of the columnar structure which is the region having a relatively higher concentration 102*a* is preferably less than or equal to 100 $\mu m^2$, and is more preferably less than or equal to 10 $\mu m^2$. Furthermore, it is preferable that the sectional area of the columnar structure is greater than or equal to 0.00001 $\mu m^2$. Here, the "sectional area of the columnar structure" is an area of the sectional surface obtained by cutting the columnar structure in a surface parallel to the boundary surface with respect to the substrate, for example, and when the columnar structure is in the shape of a cylinder, the sectional area of the columnar structure is a circular area.

That is, in this embodiment, the water-repellent film 102 illustrated in FIG. 1B is preferable to the water-repellent film 102 illustrated in FIG. 1A, and durability and dynamic water repellency are further improved as the sectional area of the columnar structure which is the region having a relatively higher concentration 102*a* becomes smaller.

In this embodiment, as illustrated in FIG. 1C, a homogeneous layer 102*c* having a homogeneous concentration of the water-repellent organic material may be included on the water-repellent film 102 illustrated in FIG. 1A or FIG. 1B. The homogeneous layer 102*c* further exists, and thus, durability is further improved.

Here, the thickness of the homogeneous layer 102*c* is less than or equal to 50% of the total thickness of the water-repellent film 102, and is preferably less than or equal to 20% of the total thickness of the water-repellent film 102.

Furthermore, the thickness of the water-repellent film is preferably 0.5 nm to 30 nm, is more preferably 0.5 nm to 10 nm, and is even more preferably 0.5 nm to 5 nm.

Figure 2A:
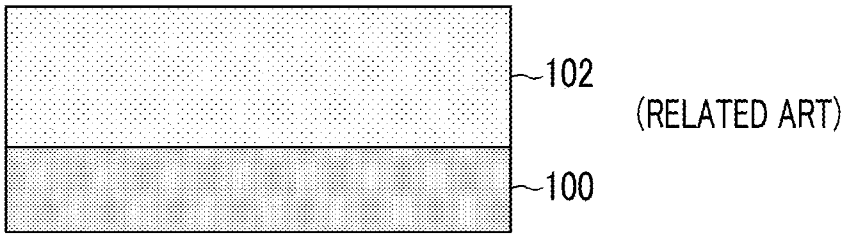
FIG. 2A is a schematic diagram for illustrating a structure of a water-repellent film of the related art.
Figure 2B:
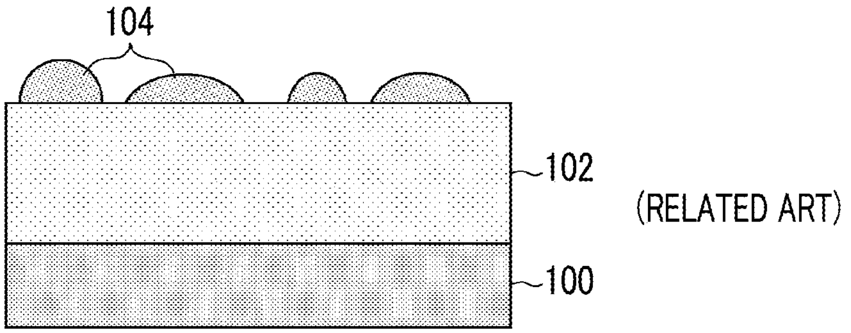
FIG. 2B is a schematic diagram for illustrating the structure of the water-repellent film of the related art.

In FIG. 2A and FIG. 2B, a structure of a water-repellent film of the related art is illustrated. FIG. 2A illustrates a water-repellent film 102 having a homogeneous concentration of a water-repellent organic material, in which regions having different concentrations do not continuously exist in a film thickness direction from a boundary surface with respect to a substrate. FIG. 2B illustrates that a water-repellent substance 104 (a second layer) is formed on the water-repellent film 102 (a first layer) of FIG. 2A in the shape of an island.

<Film Formation of Water-Repellent Film>

First, a substrate is prepared. Furthermore, in this embodiment, a nozzle plate of an ink-jet head used in an ink-jet recording device will be described as an example.

In the nozzle plate, the material configuring a substrate 100 is not particularly limited, but metal, an organic material, an inorganic material, and the like are able to be used as the material configuring the substrate 100. It is preferable that a layer containing at least Si atoms is formed on a surface on which a water-repellent film is formed. By forming the layer containing the Si atoms, it is possible to increase adhesiveness with respect to a water-repellent organic material. In addition, it is preferable that a natural oxide film, an oxide film formed by using CVD, a thermal oxide film, and the like are formed on the surface. Further, it is necessary that an oxide film or an OH group is included in the surface.

A nozzle may be disposed in advance on the substrate configuring the nozzle plate, and a nozzle hole may be formed on the nozzle plate after a water-repellent film is formed on a silicon substrate. In particular, the silicon substrate is used, and thus, a semiconductor process is able to be used, and a fine nozzle is able to be formed with high accuracy and a high concentration.

[Pretreatment]

In order to clean the surface of the nozzle plate, a plasma treatment or a UV treatment is performed. Accordingly, organic contamination or the like is removed, and an OH group which is a bonding site of the water-repellent organic material is generated, and adhesiveness of the water-repellent film is improved. The UV treatment is simple and efficient. On the other hand, the plasma treatment requires a vacuum atmosphere, but is able to remove inorganic contamination and metal contamination according to the type of introduction gas unlike the UV treatment in which only the organic contamination is removed.

[Formation of Oxide Film]

An inorganic oxide film is formed on the nozzle plate after the pre-treatment is performed. Furthermore, it is possible to form a water-repellent film described below without forming the oxide film.

A liquid phase method of applying a solution of a silicon compound onto a silicon substrate, such as a dipping method, a spin coating method, a spray coating method, and a dispenser method, and a gas phase method such as a vacuum vapor deposition method or a Chemical Vapor Deposition (CVD) method are able to be used as a formation method of the inorganic oxide film. In particular, in order to form a homogeneous inorganic oxide film on a complicated structure observed in the nozzle plate, the gas phase method is preferable. For example, in the formation of the silicon oxide film by the gas phase method, a silicon substrate is arranged in a CVD chamber, and $SiCl_4$ and water vapor are introduced into the CVD chamber, and thus, the silicon oxide film is able to be formed.

Examples of an organic film which is able to form an OH group include a silicone-based plasma polymerization film using plasma CVD, a graft film formed by a graft polymerization method, and the like. The surface of the film is subjected to an oxygen plasma treatment or a UV treatment, and thus, the OH group is able to be generated with high density.

Furthermore, in the silicone-based plasma polymerization film using the plasma CVD, materials, conditions, and methods disclosed in the specification of JP2008-105231A are able to be preferably used.

[Formation of Water-Repellent Film]

The water-repellent film is formed of a water-repellent organic material on the nozzle plate after the pre-treatment described above is performed or after the oxide film described above is formed.

A silane coupling agent is preferable as the water-repellent organic material.

The silane coupling agent is a silicon compound denoted by $Y.Si.X_{4-n}$ (n=1, 2, and 3). Y is a comparatively inert group such as an alkyl group or a group including a reactive group such as a vinyl group, an amino group, or an epoxy group. X is formed of a group which is able to be bonded by condensation with respect to a hydroxyl group such as halogen, a methoxy group, an ethoxy group, or an acetoxy group or absorbed moisture on a substrate surface. When a composite material formed of organic matter such as glass fiber reinforced plastics and inorganic matter is manufactured, the silane coupling agent is widely used as a mediator between these two types of matter, and when Y is an inert group such as an alkyl group, the silane coupling agent provides properties such as prevention of attachment or friction, glossiness retention, water repellency, and lubrication to a modified surface. In addition, when Y is a group including a reactive group, the silane coupling agent is mainly used for improving adhesive properties. Further, a surface which is modified by using a fluorine-based silane coupling agent in which a straight chain-like fluorocarbon chain is introduced into Y has low surface free energy as with a PTFE surface, has improved properties such as water repellency, lubrication, and releasing, and also exhibits oil repellency.

In addition, in this embodiment, a polymer or a copolymer of a unit monomer including one or more fluorine atoms on average, which is an organic polymer having film forming ability, is able to be used as the water-repellent organic material.

Examples of the water-repellent organic material are able to include polytetrafluoroethylene (PTFE), a tetrafluoroethylene-perfluoroalkyl vinyl ether copolymer (PFA), a tetrafluoroethylene-hexafluoropropylene-perfluoroalkyl vinyl ether copolymer, a tetrafluoroethylene-hexafluoropropylene copolymer, a tetrafluoroethylene-ethylene copolymer, a trifluoro chloroethylene polymer, a trifluorochloroethylene-ethylene copolymer, polyvinyl fluoride, polyvinylidene fluoride, fluoropolyether polymer, poly fluorosilicone, a perfluoro polymer having an alicyclic structure, and the like.

It is preferable that the water-repellent organic material is a perfluoro-based polymer, and it is more preferable that the water-repellent organic material is a polymer denoted by at least one double bond or triple bond carbon, a —COOH group, —P(═O)$(OH)_2$, or —$Si.X_{4-n}$ (n=1, 2, and 3), in which X includes a group which is able to be bonded by condensation with respect to a hydroxyl group such as halogen, a methoxy group, an ethoxy group, or an acetoxy group or absorbed moisture on the substrate surface in the molecules.

In particular, a material which has a structure of R—P(═O)$(OH)_2$ (R represents an organic group) and includes $CF_3$ on a terminal of an R portion or a material including an ether bond has been developed as a phosphonic acid derivative, and these materials are able to be preferably used as the water-repellent organic material according to this embodiment.

The water-repellent film is formed on an ejection surface side of the nozzle plate by using a vacuum vapor deposition device. However, a film formation method is not limited to vapor deposition, and Chemical Vapor Deposition (CVD), dipping, spin coating, a dispenser, a coating method, and the like may be used as the film formation method.

Furthermore, as described above, a fluorine-containing organic substance is preferable as the water-repellent organic material, and perfluoropolyether in which a group which is able to be bonded by condensation with respect to a hydroxyl group or absorbed moisture on the substrate surface is included on a main chain terminal in the molecules is able to be used as the water-repellent organic material. Examples of a commercially available product include Cytop (Registered Trademark) manufactured by ASAHI GLASS CO., LTD., Fomblin (Registered Trademark) manufactured by Solvay S. A., FluoroSurf (Registered Trademark) manufactured by FluoroTechnology Co., LTD., Optool (Registered Trademark) DSX manufactured by DAIKIN INDUSTRIES, Ltd., and the like.

In film formation conditions, exhaust is performed until the pressure in a film formation furnace becomes less than or equal to 100 Pa, preferably becomes $10^{-1}$ Pa, and more preferably becomes $10^{-2}$ Pa. After the pressure in the film formation furnace reaches a target pressure, a heating unit in which a raw material (the water-repellent organic material) is provided is heated. The temperature of the heating unit is held at a temperature of lower than or equal to 100° C., preferably at a temperature of lower than or equal to 100° C. and higher than or equal to 50° C. for 1 second to 3600 seconds, preferably for 120 seconds to 300 seconds, and then the heating unit is heated until the temperature is higher than or equal to glass transition point (Tg) of the raw material, and the temperature is held for 1 second to 3600 seconds, preferably for 120 seconds to 300 seconds. The temperature is held at least one time until the temperature reaches glass transition temperature Tg of each raw material.

It is necessary that the film formation processes are optimized according to the raw material (the water-repellent organic material), and it is also necessary that a holding temperature and a holding time are changed according to an optimized temperature of each of the raw materials.

When a raw material has Tg of approximately 350° C., for example, the heating unit is heated up to 50° C. and is held for 300 seconds, is then heated up to 150° C. and held for 300 seconds, is then is heated up to 300° C. and held for 400 seconds, is then heated up to 350° C. and is held for 300 seconds, and then the heating unit is cooled until the temperature of the heating unit is lower than or equal to 50° C. while maintaining the highest heating temperature of 350° C., and a vacuum degree at 350° C. or a vacuum degree higher than the vacuum degree at 350° C. Furthermore, a method disclosed in the specification of JP2011-73283A is able to be adopted as a post-treatment after film formation, such as cooling.

Then, nitrogen is introduced into the film formation furnace, the pressure in the furnace is set to the atmospheric pressure, and the substrate (the nozzle plate) is collected.

That is, the heating unit is held at least one time at an arbitrary temperature lower than the glass transition temperature Tg of the water-repellent organic material for a certain period of time under an atmosphere where a vacuum degree is less than or equal to 100 (Pa), and the temperature of the heating unit is set to be higher than or equal to the glass transition temperature Tg, and thus, the water-repellent film is able to be formed in which the plurality of regions having different concentrations of the water-repellent organic material are formed, and each of the regions having different concentrations continuously exists in the film thickness direction from the boundary surface with respect to the substrate. The plurality of regions having different concentrations of the water-repellent organic material are formed, and each of the regions having different concentrations continuously exists in the film thickness direction from the boundary surface with respect to the substrate, and thus, it is possible to obtain a water-repellent film having excellent durability and dynamic water repellency. Furthermore, the maximum value of the heating temperature is a temperature higher than or equal to the glass transition temperature Tg, and is preferably in a range of less than or equal to 4 times Tg.

Hereinafter, the assumed mechanism of the present invention will be described.

In a solution of the water-repellent organic material which is the silane coupling agent, it is difficult to prepare a solution of a complete single composition having purity of 100%, and materials having different molecular weights such as a material having a high molecular weight and a material having a low molecular weight, or contamination are mixed in the solution. For this reason, an evaporation temperature may be changed according to each molecular weight, and the bond of the raw material may be cut due to heat at the time of performing evaporation. For example, when the raw material is rapidly and linearly heated up to approximately the glass transition temperature Tg of the raw material, a raw material group of which the evaporation temperature is changed according to a change in the molecular weight is simultaneously evaporated, and is adsorbed onto the substrate. For this reason, a heterogeneous film is easily formed, the structure of a part of the raw material having a low evaporation temperature to which a temperature higher than the evaporation temperature is rapidly applied may be broken, and in this state, the material is attached to the substrate, and thus, it is considered that the material which does not include a bonding portion is incorporated into the film, and the film becomes more heterogeneous and a film structure having low durability is formed.

Therefore, in this embodiment, in a liquid for a raw material having a plurality of molecular weights, the raw material is heated in multiple stages (in the shape of a step) from a low temperature, as described above. First, only the raw material which is able to be evaporated at a low temperature is evaporated and is adsorbed onto the substrate without destroying the structure. Further, by holding the temperature for a certain period of time, the raw material is moved and adsorbed onto a thermodynamically stable portion on the substrate. At this time, the raw material adsorbed onto the substrate raw material is a raw material a. In addition, the raw material is further heated, and the raw material which is evaporated at the next arbitrary temperature is adsorbed onto the substrate. At this time, the raw material adsorbed onto the substrate is a raw material b. At this time, the raw material b is moved and adsorbed onto the thermodynamically stable portion, but the raw material a which is adsorbed first is affected by the raw material b, and thus, the raw material b is moved and adsorbed onto a portion which is stable for both of the raw material a and the raw material b, and the surface is reconfigured. By repeating this process, each of the raw materials is moved and adsorbed onto the stable portion, and thus, it is considered that the regions having different concentrations are formed in a self-assembling manner.

In this embodiment, properties of a self-assembled monolayer such as a silane coupling agent are controlled by the film formation process. The effect of the control described above is particularly effective not only for a raw material having a straight chain structure but also for a perfluoro-based polymer having a raw material structure which has flexibility and fluidity due to an ether structure. In the perfluoro-based polymer, it is difficult to refine a solution of the raw material, and thus, the present invention is particularly effective for a material having a low refinement degree.

<Overall Configuration of Ink-Jet Recording Device>

Next, the ink-jet recording device and the nozzle plate will be described as an example to which the water-repellent film of this embodiment is applied.

Figure 3:
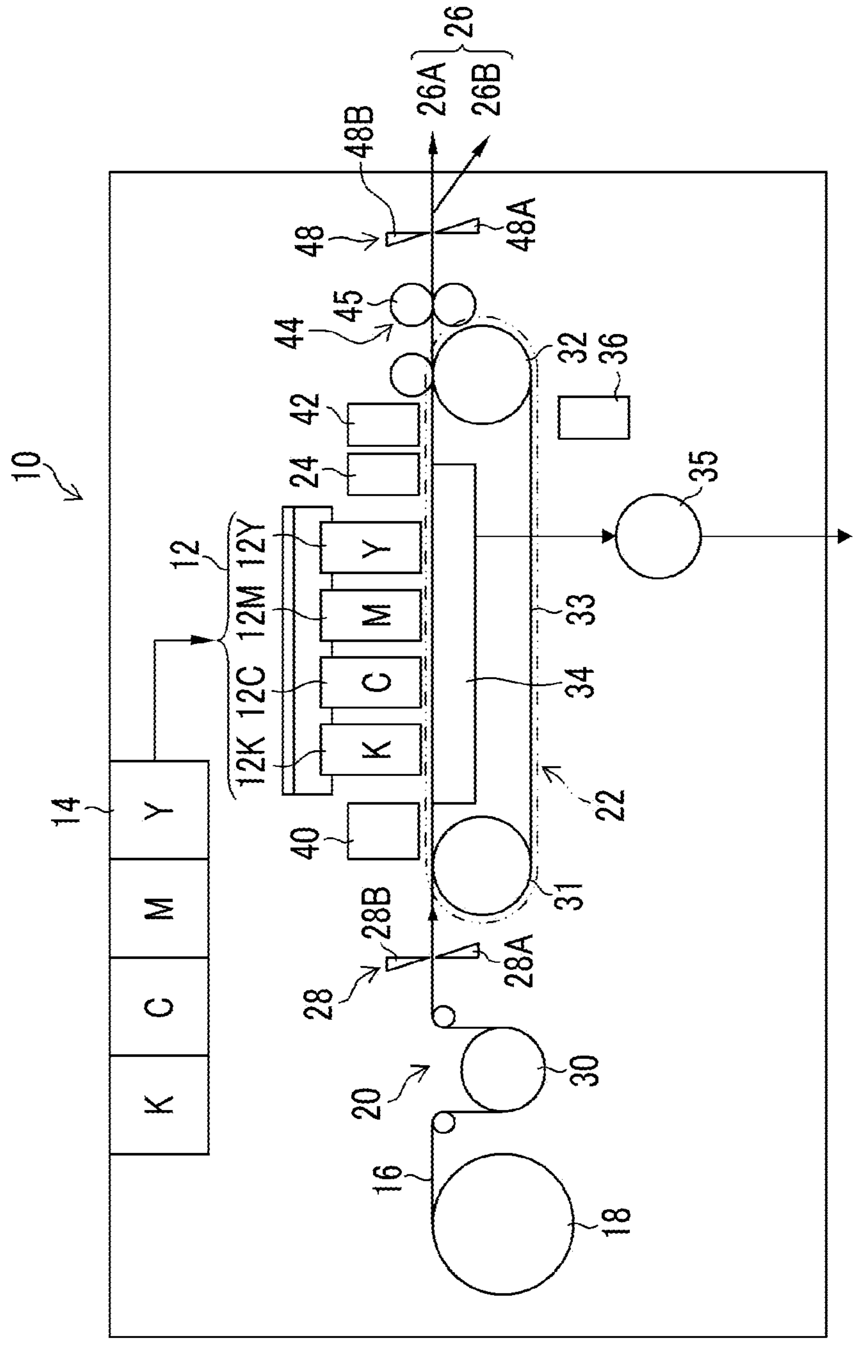
FIG. 3 is an overall configuration diagram schematically illustrating an ink-jet recording device.

FIG. 3 is an overall configuration diagram illustrating an ink-jet recording device according to this embodiment. As illustrated in FIG. 3, an ink jet recording device 10 includes a printing portion 12 which includes a plurality of ink jet heads (hereinafter, also simply referred to as a "head") 12K, 12C, 12M, and 12Y disposed for each color of ink, an ink storing/loading unit 14 which stores ink to be supplied to each of the heads 12K, 12C, 12M, and 12Y, a sheet feed unit 18 which supplies recording paper 16, a decurling treatment unit 20 which removes curling of the recording paper 16, an adsorption belt transportation unit 22 which is arranged to face a nozzle surface (an ink ejection surface) of the printing portion 12 and transports the recording paper 16 while retaining flatness of the recording paper 16, a printing detection unit 24 which reads a printing result of the printing portion 12, and a sheet discharge unit 26 which discharges the printed recording paper (a printed material) to the outside.

In FIG. 3, a magazine of rolled paper (continuously paper) is illustrated as an example of the sheet feed unit 18, a plurality of magazines having different paper widths or paper qualities may be disposed together. In addition, paper may be supplied by a cassette in which cut paper is laminated and loaded, instead of the magazine of the rolled paper or along with the magazine of the rolled paper.

In a device configuration where the rolled paper is used, as illustrated in FIG. 3, a cutter for cutting paper 28 is disposed, and the rolled paper is cut to have a desired size by the cutter 28. The cutter 28 is configured of a fixed blade 28A which has a length of greater than or equal to the width of a transportation path of the recording paper 16, and a round blade 28B which is moved along the fixed blade 28A, and the fixed blade 28A is disposed on a printing back surface side and the round blade 28B is arranged on a printing surface side by interposing the transportation path between the fixed blade 28A and the round blade 28B. Furthermore, in a device configuration where the cut paper is used, the cutter 28 is not necessary.

In a configuration where a plurality of types of recording papers are able to be used, it is preferable that an information recording medium in which type information of the paper is recorded, such as a bar code or a wireless tag, is attached to the magazine, and the information of the information recording medium is read by a predetermined reading device, and thus, the type of paper to be used is automatically determined, and ink ejection is controlled such that suitable ink ejection is realized according to the type of paper.

The recording paper 16 delivered from the sheet feed unit 18 is loaded on the magazine, and thus, curling remains and the paper is curled. In order to remove the curling, the recording paper 16 is heated by a heating drum 30 of the decurling treatment unit 20 in a curling direction of the magazine and a reverse direction thereof. At this time, it is more preferable that a heating temperature is controlled such that a printing surface is slightly curled to the outside.

After the decurling treatment, the cut recording paper 16 is delivered to the adsorption belt transportation unit 22. The adsorption belt transportation unit 22 has a structure in which an endless belt 33 is wound between rollers 31 and 32, and is configured such that at least a portion facing the nozzle surface of the printing portion 12 and a sensor surface of the printing detection unit 24 becomes a flat surface.

The belt 33 has a width which is wider than that of the recording paper 16, and a plurality of suction holes (not illustrated) are formed on a belt surface. As illustrated in FIG. 3, an adsorption chamber 34 is disposed in a position facing the nozzle surface of the printing portion 12 and the sensor surface of the printing detection unit 24 on the inner side of the belt 33 stretched between the rollers 31 and 32, and the adsorption chamber 34 is sucked by a fan 35 such that a negative pressure is set, and thus, the recording paper 16 on the belt 33 is adsorbed and held.

Power of a motor (not illustrated) is transmitted to at least one of the rollers 31 and 32 around which the belt 33 is wound, and in FIG. 3, the belt 33 is driven in a clockwise direction, the recording paper 16 held on the belt 33 is transported from the left side to the right side of FIG. 3.

When edgeless print or the like is printed, ink is also attached onto the belt 33, and thus, a belt cleaning unit 36 is disposed in a predetermined position on the outer side of the belt 33 (a suitable position other than a printing region). The detailed configuration of the belt cleaning unit 36 is not illustrated, and examples of the configuration of the belt cleaning unit 36 include a configuration of nipping a brush and a roll, a water absorbent roll, and the like, an air blow type configuration of blowing clean air, or a combination thereof. When the belt cleaning unit 36 has a configuration of nipping a cleaning roll, a cleaning effect increases at the time of changing a belt linear velocity and a roller linear velocity.

Furthermore, an aspect is also considered in which a roller nipping transportation mechanism is used instead of the adsorption belt transportation unit 22, but when the printing region is transported by roller nipping, the roller is in contact with the printing surface of the paper before and after the printing, and thus, a problem occurs in which image bleeding easily occurs. Therefore, as described in this example, adsorption belt transportation is preferable in which contact with respect to an image surface does not occur in the printing region.

A heating fan 40 is disposed on the upstream side on a paper transportation path of the printing portion 12 formed by the adsorption belt transportation unit 22. The heating fan 40 blows heating air to the recording paper 16 before being printed and heats the recording paper 16. The recording paper 16 is heated immediately before being printed, and thus, ink is easily dried after landing.

Figure 4:
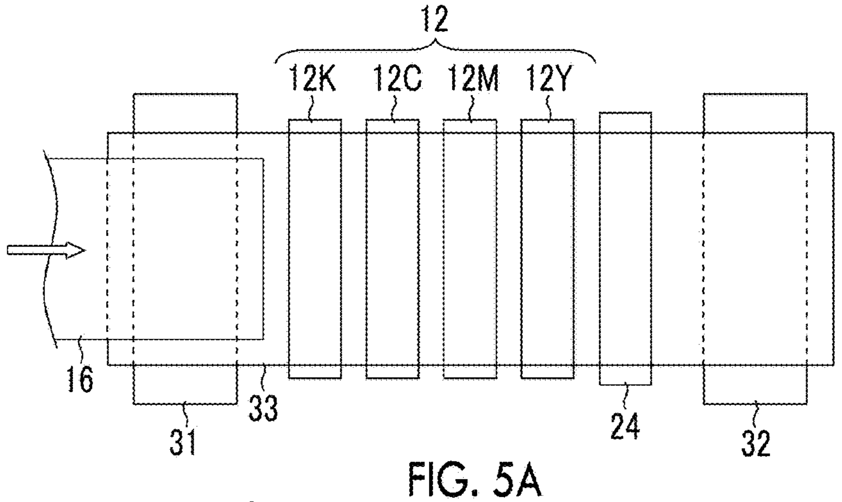
FIG. 4 is a plan view of main parts in the vicinity of a printing portion of the ink jet recording device illustrated in FIG. 3.

The printing portion 12 is formed of a so-called full-line type head in which a line type head having a length corresponding to the maximum paper width is arranged in a direction (a main scanning direction) orthogonal to a sheet transportation direction (a sub scanning direction). Each of the heads 12K, 12C, 12M, and 12Y configuring the printing portion 12 is configured of a line type head in which a plurality of ink ejection ports (nozzles) are arranged over a length greater than at least one side of the recording paper 16 having the maximum target size of the ink-jet recording device 10 (refer to FIG. 4).

The heads 12K, 12C, 12M, and 12Y corresponding to each color ink are arranged in the order of black (K), cyan (C), magenta (M), and yellow (Y) from the upstream side (the left side of FIG. 3) along a transportation direction of the recording paper 16 (the sheet transportation direction). Each color ink is ejected from the heads 12K, 12C, 12M, and 12Y while transporting the recording paper 16, and thus, a color image is able to be formed on the recording paper 16.

Thus, according to the printing portion 12 in which the full-line head covering the entire range of the paper width is disposed for each ink color, an operation for relatively moving the recording paper 16 and the printing portion 12 in the sheet transportation direction (the sub scanning direction) is performed one time (that is, single sub scanning), and thus, it is possible to record an image on the entire surface of the recording paper 16. Accordingly, it is possible to perform high speed printing compared to a shuttle type head in which the head performs a reciprocating operation in a direction (the main scanning direction) orthogonal to the sheet transportation direction, and it is possible to improve productivity.

Further, in this example, the configuration of standard colors of KCMY (4 colors) is exemplified, a combination of ink colors or the number of colors is not limited to this embodiment, and thin ink and thick ink may be added as necessary. For example, it is possible to use a configuration in which a head ejecting light ink such as light cyan and light magenta is added.

As illustrated in FIG. 3, the ink storing/loading unit 14 includes a tank which stores ink having a color corresponding to each of the heads 12K, 12C, 12M, and 12Y, and each tank is communicated with each of the heads 12K, 12C, 12M, and 12Y through a pipe line (not illustrated). In addition, the ink storing/loading unit 14 includes notification means (display means, warning sound generating means, and the like) which notifies that the ink residual amount has decreased, and a mechanism for preventing erroneous loading between colors.

The printing detection unit 24 includes an image sensor (a line sensor and the like) for imaging a droplet hit result of the printing portion 12, and functions as means for checking clogging of the nozzle or other ejection failures from a droplet hitting image which is read by the image sensor.

The printing detection unit 24 of this example is configured of a line sensor including a light receiving element array having a width which is wider than an ink ejection width (an image recording width) of at least each of the heads 12K, 12C, 12M, and 12Y. The line sensor is configured of a chromatic resolving line CCD sensor formed of an R sensor array in which photoelectric conversion elements (pixels) provided with a red (R) color filter are arranged in the shape of a line, a G sensor array in which a green (G) color filter is disposed, and a B sensor array in which a blue (B) color filter is disposed. Furthermore, it is possible to use an area sensor formed by two-dimensionally arranging the light receiving elements instead of the line sensor.

The printing detection unit 24 reads a test pattern printed by the heads 12K, 12C, 12M, and 12Y having each color, and performs ejection detection with respect to each of the heads. Ejection determination is configured of the presence or absence of the ejection, measurement of the dot size, measurement of a dot landing position, and the like.

A post-drying unit 42 is disposed on the latter stage of the printing detection unit 24. The post-drying unit 42 is means for drying the printed image surface, and for example, a heating fan is used as the post-drying unit 42. It is preferable that the post-drying unit 42 is prevented from being in contact with the printing surface until the ink is dried after being printed, and thus, a method of blowing hot air is preferable.

In a case where porous paper is printed on with dye-based ink, and the like, the pores of the paper are blocked by pressurization, and thus, the dye-based ink is prevented from coming in contact with a factor which destroys dye molecules, such as ozone, and an effect is obtained in which weather resistance of the image increases.

A heating and pressurizing unit 44 is disposed on the latter stage of the post-drying unit 42. The heating and pressurizing unit 44 is means for controlling glossiness of the image surface, pressurizes the image surface with a pressurize roller 45 having a predetermined surface irregular shape while heating the image surface, and transfers the irregular shape onto the image surface.

The printed material generated as described above is discharged from the sheet discharge unit 26. It is preferable that a real image which is originally planned to be printed (an image on which the image of an object is printed) and test printing are separately discharged. In order to sort a printed material of the real image and a printed material of the test printing and to deliver each of the printed materials to discharge units 26A and 26B, sorting means (not illustrated) for switching a discharge path is disposed in the ink jet recording device 10. Furthermore, when the real image and the test printing are simultaneously formed on large-sized paper in parallel, a portion of the test printing is cut off by a cutter (a second cutter) 48. The cutter 48 is disposed immediately in front of the sheet discharge unit 26, and when the test printing is performed with respect to an image margin portion, the cutter 48 cuts the real image and a test printing portion. The structure of the cutter 48 is identical to that of the first cutter 28 described above, and the cutter 48 is configured of a fixed blade 48A and a round blade 48B.

In addition, even though it is not illustrated, a sorter which integrates images according to the order is disposed in the discharge unit 26A of the real image.

[Structure of Head]

Next, the structure of the heads 12K, 12C, 12M, and 12Y will be described. Furthermore, each of the heads 12K, 12C, 12M, and 12Y has a common structure, and thus, hereinafter, the head will be representatively denoted by a reference number of 50.

Figure 5A:
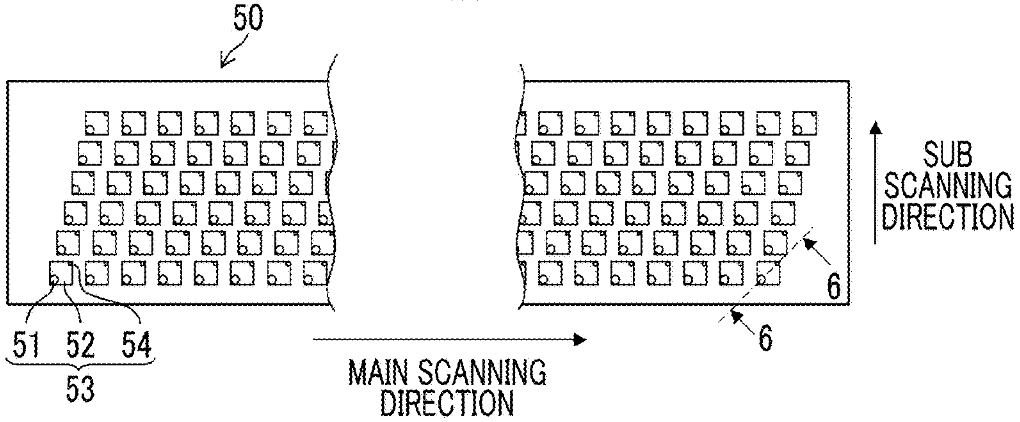
FIG. 5A is a perspective plan view illustrating a structure example of a head.
Figure 5B:
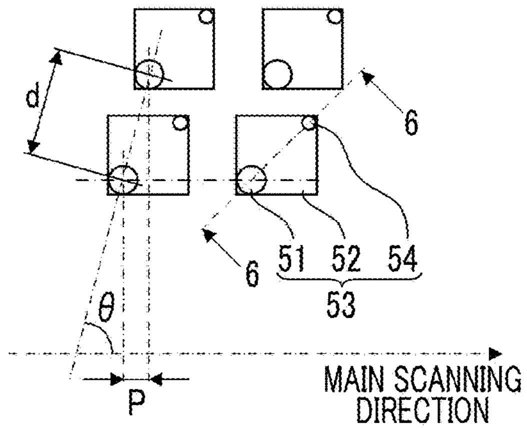
FIG. 5B is a perspective plan view illustrating the structure example of the head.
Figure 5C:
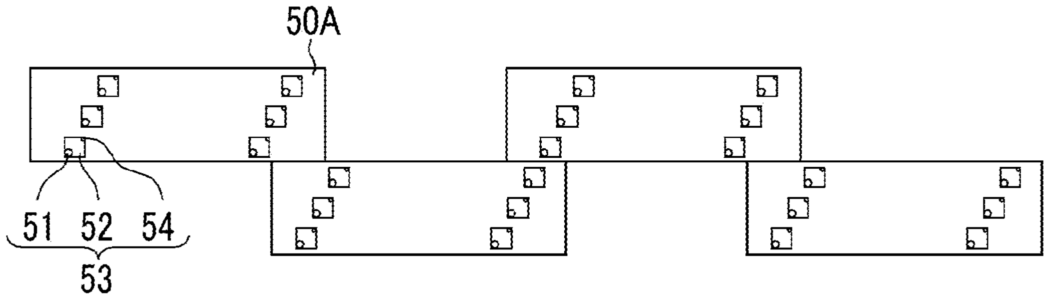
FIG. 5C is a perspective plan view illustrating the structure example of the head.
Figure 6:
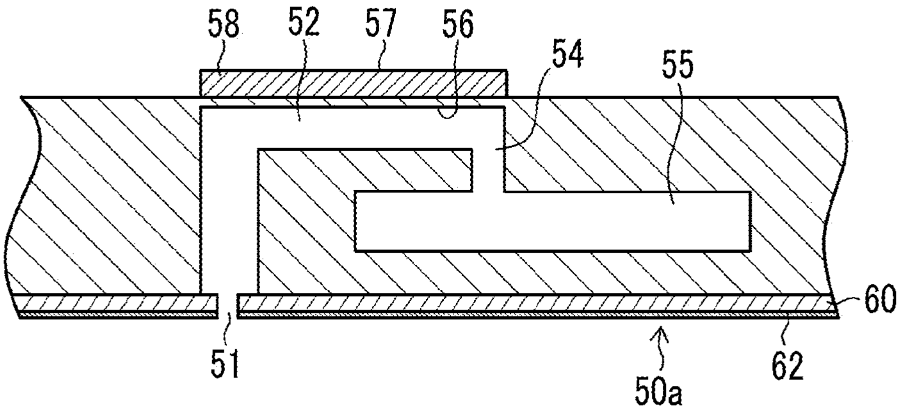
FIG. 6 is a sectional view taken along line 6-6 of FIG. 5A and FIG. 5B.

FIG. 5A is a perspective plan view illustrating a structure example of a head 50, and FIG. 5B is an enlarged diagram of a part of the head 50. In addition, FIG. 5C is a perspective plan view illustrating the other structure example of the head 50. FIG. 6 is a sectional view (in FIG. 5A and FIG. 5B, a sectional view taken along line 6-6) illustrating a three-dimensional configuration of an ink chamber unit.

In order to increase the density of a dot pitch formed on the surface of the recording paper, it is necessary to increase the density of a nozzle pitch in the head 50. As illustrated in FIG. 5A and FIG. 5B, the head 50 of this example has a structure in which a plurality of ink chamber units 53 formed of nozzles 51 which are ejection holes of ink droplets, a pressure chamber 52 corresponding to each of the nozzles 51, and the like are (two-dimensionally) arranged in a zigzag in the shape of a matrix, and thus, an increase in the density of a substantial nozzle interval (a projection nozzle pitch) which is projected to be arranged along a longitudinal direction of the head (the main scanning direction orthogonal to the sheet transportation direction) is attained.

An aspect of configuring one or more nozzle arrays over a length corresponding to the entire width of the recording paper 16 in the direction orthogonal to the sheet transportation direction is not limited to this example. For example, as illustrated in FIG. 5C, instead of the configuration of FIG. 5A, the line head including a nozzle array having a length corresponding to the entire width of the recording paper 16 may be configured by arranging short head blocks (head chips) 50A in which a plurality of nozzles 51 are two-dimensionally arranged in a zigzag and by connecting the short head blocks 50A to each other. In addition, even though it is not illustrated, the line head may be configured by arranging short heads in a row.

As illustrated in FIG. 6, each of the nozzles 51 is formed on a nozzle plate 60 configuring an ink ejection surface 50*a* of the head 50. The nozzle plate 60, for example, is configured of a silicon-based material such as Si, $SiO_2$, SiN, and quartz glass, a metal-based material such as Al, Fe, Ni, Cu, or an alloy thereof, an oxide material such as alumina and iron oxide, a carbon-based material such as carbon black and graphite, and a resin-based material such as polyimide.

A water-repellent film 62 having liquid repellency with respect to ink is formed on the surface of the nozzle plate 60 (the surface on the ink ejection side), and the ink is prevented from being attached onto the surface. Furthermore, the formation of the water-repellent film 62 is as described above.

The planar shape of the pressure chamber 52 disposed correspondingly to each of the nozzles 51 is an approximately square shape, and the nozzle 51 and a supply port 54 are disposed in both corner portions on a diagonal line. Each of the pressure chambers 52 is communicated with a common flow path 55 through the supply port 54. The common flow path 55 is communicated with an ink supply tank (not illustrated) which is an ink supply source, and ink supplied from the ink supply tank is distributed and supplied to each of the pressure chambers 52 through the common flow path 55.

A piezoelectric element 58 including an individual electrode 57 is bonded to a vibration plate 56 which configures the top surface of the pressure chamber 52 and is also used as a common electrode, and the piezoelectric element 58 is deformed by applying a driving voltage to the individual electrode 57, and thus, ink is ejected from the nozzle 51. When the ink is ejected, new ink is supplied to the pressure chamber 52 from the common flow path 55 through the supply port 54.

The piezoelectric element 58 is applied to this example as ejection force generating means of the ink ejected from the nozzle 51 disposed in the head 50 ink, and a thermal method in which a heater is included in the pressure chamber 52, and ink is ejected by using a pressure of film boiling due to heating of the heater is able to be applied to this example.

As illustrated in FIG. 5B, a plurality of ink chamber units 53 having such a structure are arranged in the shape of a lattice in a certain arrangement pattern along a row direction along the main scanning direction and a column direction having a certain angle θ which is not orthogonal to the main scanning direction, and thus, a high density nozzle head of this example is realized.

That is, according to a structure in which plurality of ink chamber units 53 are arranged at a certain pitch d along a direction of a certain angle θ with respect to the main scanning direction, a pitch P of the nozzle which is projected to be arranged in the main scanning direction is d×cos θ, and is able to be equivalently considered as a structure in which each of the nozzles 51 are linearly arranged at a certain pitch P in the main scanning direction. According to such a configuration, it is possible to realize a high density nozzle configuration in which the density of nozzle arrays projected to be arranged in the main scanning direction is 2400 per 1 inch (2400 nozzles/inch).

Furthermore, in implementation of the present invention, the arrangement structure of the nozzle is not limited to the illustrated example, and various nozzle arrangement structures such as an arrangement structure including one nozzle array in the sub scanning direction are able to be applied.

In addition, the application range of the present invention is not limited to a printing method of a line type head, and a serial method may be applied in which a short head having a length which is shorter than that of the recording paper 16 in a width direction (the main scanning direction) performs scanning in the width direction of the recording paper 16 and performs printing in the width direction, when single printing in the width direction ends, the recording paper 16 is moved in the direction (the sub scanning direction) orthogonal to the width direction by a predetermined amount, and printing is performed with respect to the next printing region in the width direction of the recording paper 16, and thus, printing is performed with respect to the entire surface of the printing region of the recording paper 16 by repeating this operation.

EXAMPLES

Hereinafter, the present invention will be described in more detail with reference to examples of the present invention. Furthermore, materials, use amounts, ratios, treatment contents, treatment sequences, and the like described in the following examples are able to be suitably changed unless the change deviates from the gist of the present invention. However, the scope of the present invention will not be restrictively interpreted by the following specific examples.

A $SiO_2$ film was formed on a Si substrate by Chemical Vapor Deposition (CVD), and the surface thereof was cleaned with oxygen plasma.

Sample 1: Comparative Example 1H, 1H, 2H, 2H-perfluorodecyl trichlorosilane (FDTS) was used as a water-repellent organic material, and a water-repellent film was formed by CVD.

Sample 2: Example

Optool DSX manufactured by DAIKIN INDUSTRIES, Ltd. was used as a water-repellent organic material, and a water-repellent film was formed by using a vacuum vapor deposition device. As illustrated in a graph of FIG. 7, in a film formation process, heating up to 50° C. and holding for 300 seconds were performed, then heating up to 150° C. and holding for 300 seconds were performed, then heating up to 300° C. and holding for 300 seconds were performed, and then heating up to 350° C. and holding for 300 seconds were performed. After the film was formed, nitrogen was introduced into a film formation furnace, the pressure in the furnace became the atmospheric pressure, and a substrate was collected.

Sample 3: Example

Figure 7:
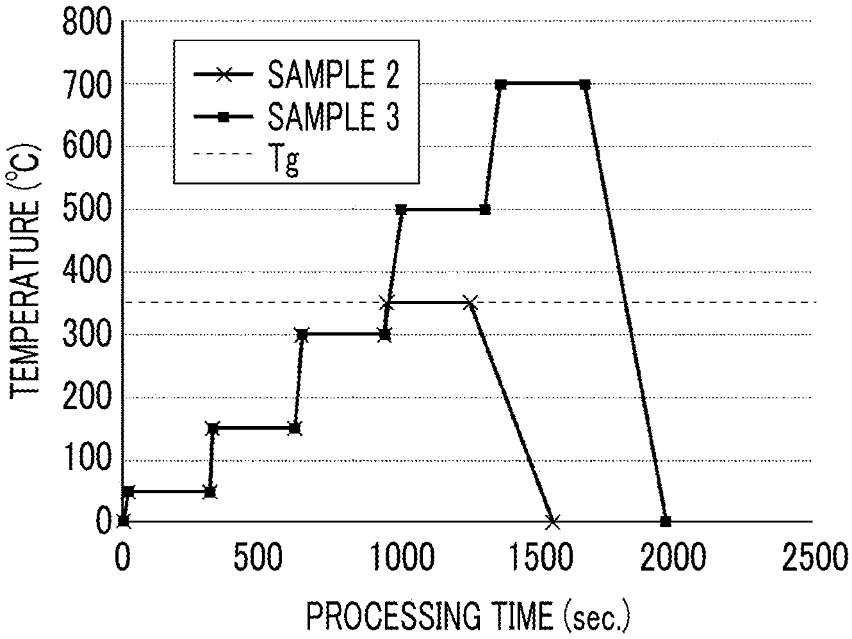
FIG. 7 is a graph diagram illustrating a film formation process in a test.

Optool DSX manufactured by DAIKIN INDUSTRIES, Ltd. was used as a water-repellent organic material, and a water-repellent film was formed by using a vacuum vapor deposition device. As illustrated in the graph of FIG. 7, in film formation process, heating up to 50° C. and holding for 300 seconds were performed, then heating up to 150° C. and holding for 300 seconds were performed, then heating up to 300° C. and holding for 300 seconds were performed, then heating up to 500° C. and holding for 300 seconds were performed, and then heating up to 700° C. and holding for 300 seconds were performed. After the film was formed, nitrogen was introduced into a film formation furnace, the pressure in the furnace became the atmospheric pressure, and a substrate was collected.

Sample 4: Example

Optool DSX manufactured by DAIKIN INDUSTRIES, Ltd. was used as a water-repellent organic material, and a water-repellent film was formed by using a vacuum vapor deposition device. As illustrated in the graph of FIG. 7, in film formation process, heating up to 50° C. and holding for 300 seconds were performed, then heating up to 150° C. and holding for 300 seconds were performed, then heating up to 300° C. and holding for 300 seconds were performed, then heating up to 500° C. and holding for 300 seconds were performed, and then heating up to 700° C. and holding for 300 seconds were performed. After the film was formed, a substrate was disposed in a thermostatic bath, and was left to stand for greater than or equal to 1 hour under an environment of a temperature of higher than or equal to 30° C. and humidity of greater than or equal to 50%.

<Structure Analysis of Water-Repellent Film>

Figure 8:
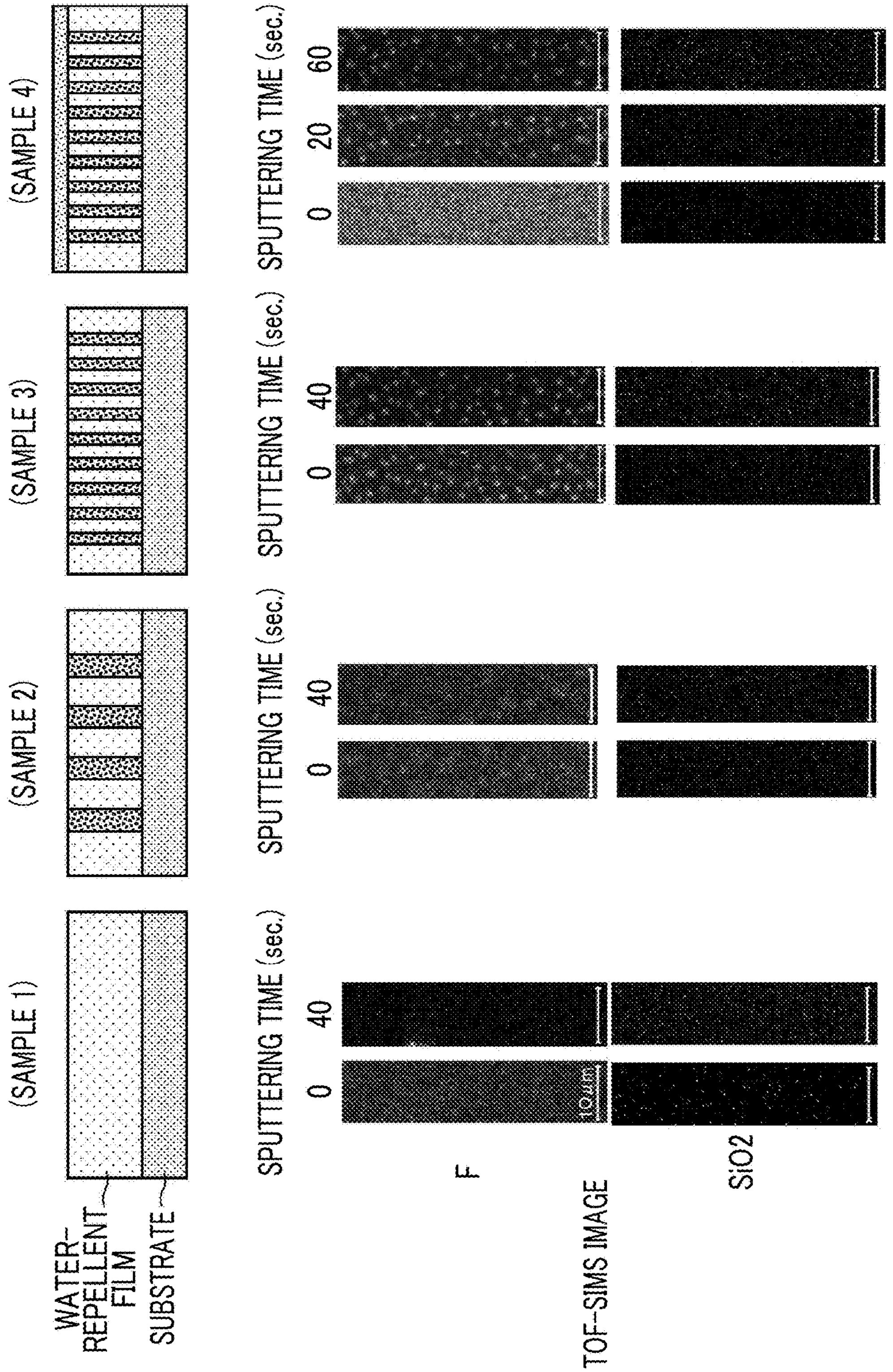
FIG. 8 is a diagram illustrating an analysis result of TOF-SIMS.

Each sample was subjected to sputtering from the surface for an arbitrary period of time by using Time of Flight Secondary Ion Mass Spectrometer PHI TRIFT V nano TOF (TOF-SIMS, manufactured by ULVAC-PHI, INCORPORATED), and composition analysis was performed. Furthermore, a primary ion source was set to $Bi_3^{++}$, and distribution analysis in a depth direction was performed by cluster ion sputtering (Accelerating Voltage: 10 kV). The analysis results are shown in FIG. 8.

As a result thereof, the sample 1 did not have a columnar structure, and fluorine was distributed at a certain concentration until $SiO_2$ on the base substrate was detected.

On the other hand, in the sample 2, it was found that a region having a high concentration (high density) of fluorine existed from the uppermost surface to the base substrate, and a columnar structure was obtained. In addition, in the sample 3, it was found that the concentration of a columnar structure (for example, the number of columnar structures in the vicinity of the unit area) was improved compared from that of the sample 2. Further, in the sample 4, it was found that one layer having a homogeneous concentration of fluorine (F) was included on the structure of the sample 3.

<Evaluation of Durability>

In the samples 1 to 4, a durability test was performed by using ink having compositions described below. Furthermore, the ink is an alkali solution including a black pigment, and in general, carbon black is used as the black pigment, the ink used in this durability evaluation test is in a state where abrasive particles are added to an alkali solution, and evaluation was performed under more compulsive conditions than those of a rubbing test of cloth for maintenance or a single rubber blade (more rigorous conditions and conditions where abrasion is more easily performed). In addition, pH of the ink was 8.6.

[[Composition of Ink]] (Black Aqueous Pigment Ink)

Black Pigment (Carbon Black): 4%

Pigment Dispersant (Polymer Dispersant P-1): 2%

Sunnix (Registered Trademark) GP-250 (manufactured by Sanyo Chemical Industries, Ltd): 10%

Tripropylene Glycol Monomethyl Ether: 5%

Olefin (Registered Trademark) E1010 (manufactured by Nissin Chemical Co., Ltd.): 0.5%

Olefin (Registered Trademark) E1020 (manufactured by Nissin Chemical Co., Ltd.): 1%

Self-Dispersible Polymer Particles (B-01): 8%

BYK-024 (Polysiloxane-Based Anti-foaming Agent): 0.01%

Water: 69.49%

[Ink Resistance Evaluation]

Each of the samples was dipped in the ink, was disposed in a thermostatic bath of which the temperature was set to 60° C., and was taken out after an arbitrary period of time had elapsed, and thus, a static contact angle was measured by the same ink as the dipped ink.

[Anti-Wiping Property Evaluation]

A solution in which ink was mixed into an alkaline maintenance liquid for an ink-jet head nozzle surface such that the amount of ink was 5% was dropped on a cloth for wiping the nozzle surface. Each of the samples was pressed against the surface onto which the solution was dropped at a constant pressure of 50 kPa, and was subjected to reciprocating sliding. 10 mL of the mixed solution was dropped for each reciprocating and was subjected to a treatment an arbitrary number of times, and then a static contact angle was measured by the same ink as the dropped ink.

[Measurement of Contact Angle]

A static contact angle and a dynamic contact angle (a sliding down method) were evaluated by using a contact angle meter (DM-701) manufactured by Kyowa Interface Science Co., LTD. Furthermore, the dynamic contact angle was evaluated by using pure water (5 μL) as a droplet, and a case where an end portion of the substrate which was in contact with the droplet was moved by 1.0 mm at the time of inclining the substrate was determined as a case where the droplet was slid down.

<<Test Result>>

Figure 9:
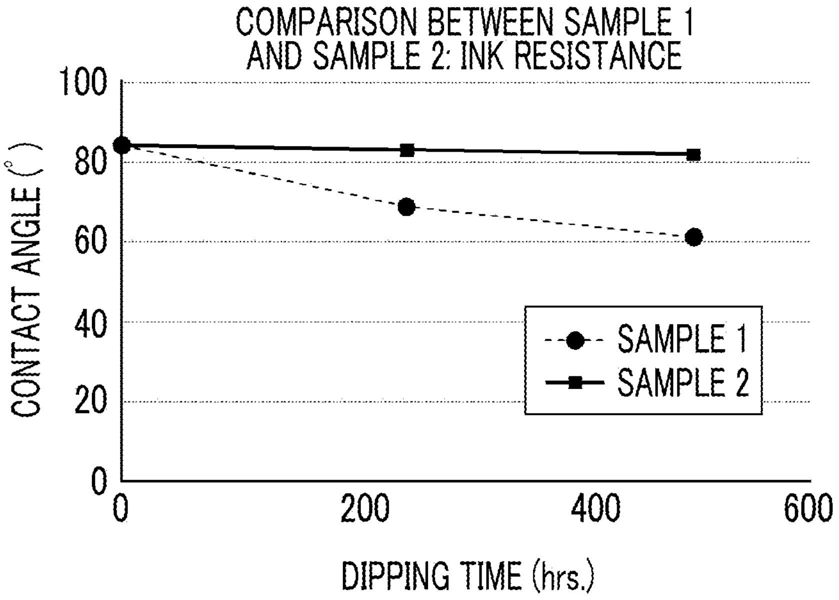
FIG. 9 is a graph diagram illustrating ink resistance of a sample 1 and a sample 2.
Figure 10:
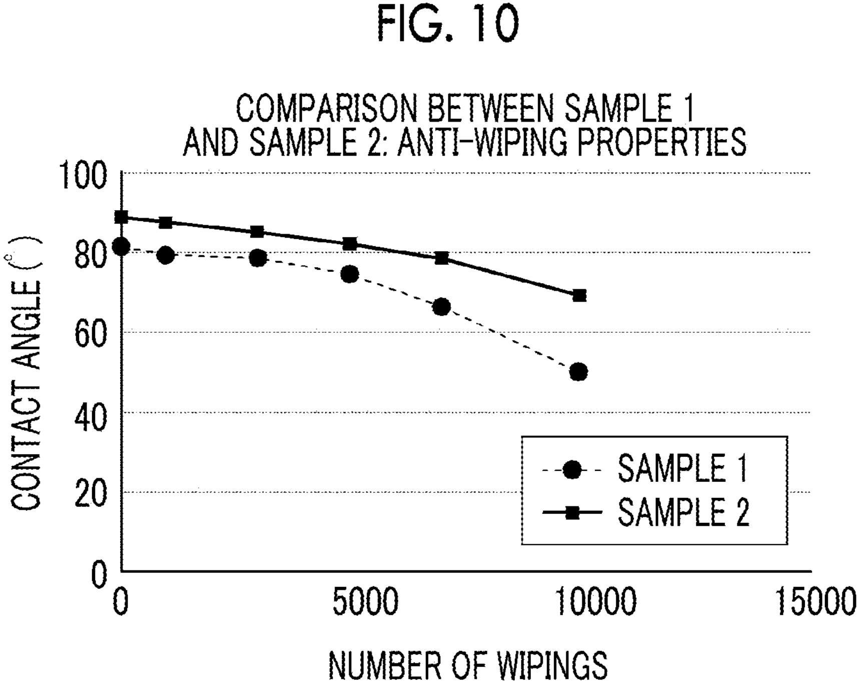
FIG. 10 is a graph diagram illustrating anti-wiping properties of the sample 1 and the sample 2.
Figure 11:
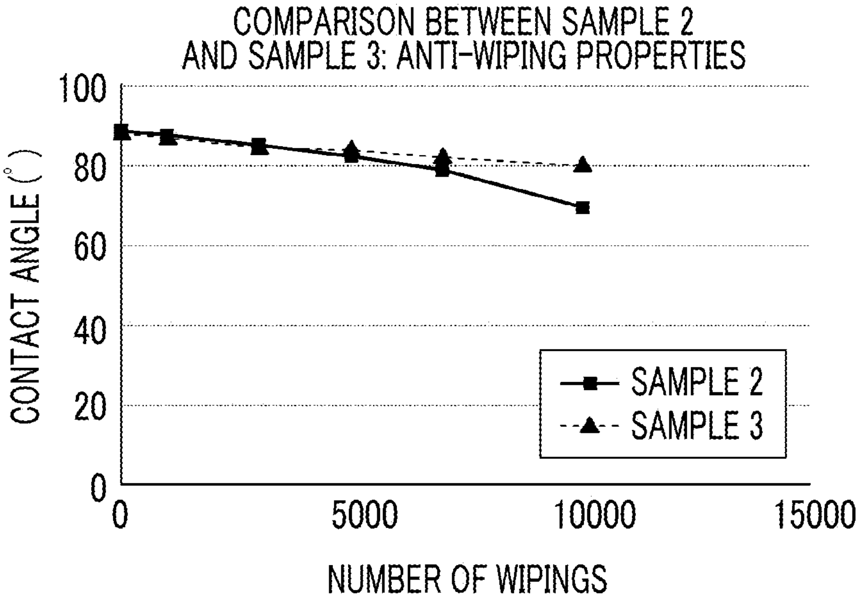
FIG. 11 is a graph diagram illustrating anti-wiping properties of the sample 2 and a sample 3.
Figure 12:
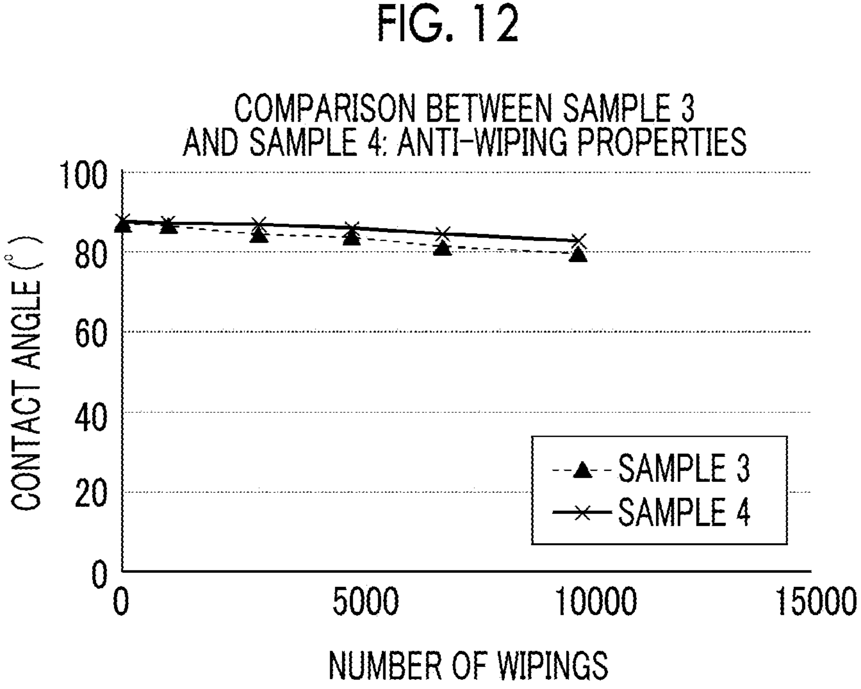
FIG. 12 is a graph diagram illustrating anti-wiping properties of the sample 3 and a sample 4.

The test results of the ink resistance and the anti-wiping properties are shown in FIG. 9 to FIG. 12. Furthermore, FIG. 9 and FIG. 10 are graphs illustrating the ink resistance and the anti-wiping properties of the sample 1 and the sample 2. FIG. 11 is a graph illustrating the anti-wiping properties of the sample 2 and the sample 3, and FIG. 12 is a graph illustrating the anti-wiping properties of the sample 3 and the sample 4.

In a case where a static contact angle of 60° was set to a deterioration reaching point, when a dipping time or the number of wipings at the time reaching 60° from a linear approximate curve was calculated, from FIG. 9, it was found that the ink resistance of the sample 2 was 12 times that of the sample 1, and from FIG. 10, it was found that the anti-wiping properties of the sample 2 were 2 times those of the sample 1. In addition, the dynamic contact angle of the sample 1 was 90°, and the dynamic contact angle of the sample 2 was 50°. Accordingly, it is found that the sample 2 is a water-repellent film having excellent durability and dynamic water repellency.

Then, when the number of wipings at the time of reaching 60° from the linear approximate curve was calculated from FIG. 11, the number of wipings of the sample 3 was 2.4 times that of the sample 2. In addition, the dynamic contact angle of the sample 3 was 30°. Accordingly, it is found that the sample 3 is a water-repellent film having more excellent durability and dynamic water repellency than the sample 2.

In addition, when the number of wipings at the time of reaching 60° from the linear approximate curve was calculated from FIG. 12, the number of wipings of the sample 4 was 1.4 times that of the sample 3. Accordingly, it is found that the sample 4 is a water-repellent film having more excellent durability and dynamic water repellency than the sample 3.

Furthermore, ink is not limited to the ink described above, and the same effect is also confirmed in commercially available water soluble pigment ink, UV ink, and UV aqueous pigment ink. In the water-repellent film of the present invention, a high durability enhancement effect can be expected with respect to pigment and dye ink and various solutions without being limited to ink. Therefore, in the water-repellent film of the present invention, a high durability enhancement effect can be expected by forming a film on a member in various industrial fields without being limited to the nozzle plate.

EXPLANATION OF REFERENCES

10: ink-jet recording device
12 (12K, 12C, 12M, and 12Y): ink-jet head
50: head
51: nozzle
52: pressure chamber
54: ink supply port
55: common liquid chamber
58: piezoelectric element
60: nozzle plate
62: water-repellent film
100: substrate
102: water-repellent film
102*a*: region having relatively higher concentration
102*b*: region having relatively lower concentration
102*c*: homogeneous layer (having homogeneous concentration)
104: water-repellent substance

What is claimed is:

1. A water-repellent film, comprising:

a substrate; and a water-repellent organic material provided on the substrate, wherein a plurality of regions are formed on the substrate, each of the plurality of regions comprise the water-repellant organic material, the plurality of regions having different concentrations of the water-repellent organic material, and each of the regions having different concentrations continuously exists in a film thickness direction from a boundary surface with respect to the substrate to a surface of the water-repellent film.

2. A water-repellent film, comprising:

a substrate; and a water-repellent organic material provided on the substrate, wherein a homogeneous layer having a homogeneous concentration of the water-repellent organic material is included on a surface of the water-repellent film, a plurality of regions having different concentrations of the water-repellent organic material are formed in the water-repellent film excluding the homogeneous layer, and each of the regions having different concentrations continuously exists in a film thickness direction from a boundary surface with respect to the substrate to the homogeneous layer.

3. The water-repellent film according to claim 1, wherein the regions having different concentrations are formed such that a region having a relatively higher concentration has a columnar structure, and a region having a relatively lower concentration than that of the columnar structure exists around the columnar structure.

4. The water-repellent film according to claim 2, wherein the regions having different concentrations are formed such that a region having a relatively higher concentration has a columnar structure, and a region having a relatively lower concentration than that of the columnar structure exists around the columnar structure.

5. The water-repellent film according to claim 3, wherein a sectional area of the columnar structure obtained by cutting the columnar structure in a surface parallel to the boundary surface with respect to the substrate is less than or equal to 100 $\mu m^2$.

6. The water-repellent film according to claim 5, wherein the sectional area of the columnar structure is less than or equal to 10 $\mu m^2$.

7. The water-repellent film according to claim 1, wherein the water-repellent organic material is a silane coupling agent.

8. The water-repellent film according to claim 2, wherein the water-repellent organic material is a silane coupling agent.

9. The water-repellent film according to claim 1, wherein the water-repellent organic material is a phosphonic acid derivative.

10. The water-repellent film according to claim 2, wherein the water-repellent organic material is a phosphonic acid derivative.

11. The water-repellent film according to claim 6, wherein the water-repellent organic material contains fluorine.

12. The water-repellent film according to claim 11, wherein the water-repellent organic material includes an ether bond.

13. The water-repellent film according to claim 1, wherein the water-repellent organic material is formed by a gas phase method.

14. A film formation method for forming the water-repellent film according to claim 1, the method, comprising:

holding the water-repellent film at least one time at a temperature lower than a glass transition temperature Tg of the water-repellent organic material for a certain period of time under an atmosphere in which a vacuum degree is less than or equal to 100 (Pa) to be a temperature higher than or equal to the glass transition temperature Tg.

15. A nozzle plate comprising the water-repellent film according to claim 1.

16. An ink-jet head comprising the nozzle plate according to claim 15.

17. An ink-jet recording device comprising the ink-jet head according to claim 16.

* * * * *